April 2, 1968 G. E. SMITH 3,376,430

HIGH SPEED TUNNEL DIODE COUNTER

Filed Oct. 11, 1965

INVENTOR

GEORGE E. SMITH

BY Sughrue, Rothwell, Mion, Zinn & Macpeak

ATTORNEYS

United States Patent Office 3,376,430

Patented Apr. 2, 1968

3,376,430

HIGH SPEED TUNNEL DIODE COUNTER

George E. Smith, Bridgeton, Mo., assignor to Monsanto Company, St. Louis, Mo., a corporation of Delaware Filed Oct. 11, 1965, Ser. No. 494,471
10 Claims. (Cl. 307—225)

ABSTRACT OF THE DISCLOSURE

A counter circuit employing $n+1$ tunnel diode stages to count $2n$ bits in a successive progression and regression manner. The stages are all connected in parallel between positive and negative diode gated pulse input lines and adjacent stages are coupled through diode gated biasing networks. The last stage is coupled to the first stage through an inverter. With such an arrangement, one stage is always preconditioned near its switching threshold, and when it switches, it preconditions the next stage. When the last stage is switched, the inverted feedback re-switches the first stage, which in turn preconditions the next stage for re-switching, and so on. The preconditioning action is effected by current steering through the interstage coupling biasing networks.

This invention relates in general to an electronic counting circuit, and more particularly to a novel high speed counter employing negative resistance devices, such as tunnel diodes, as the bistable switching elements.

Following the comparatively recent development of tunnel diode semiconductive devices and the recognition of high speed switching capabilities, a number of electronic counter circuits were designed employing them as the bistable elements to achieve greater operating speeds. In most instances, however, these prior art counters involve very extensive and complex circuitry to establish the necessary biasing levels for the tunnel diodes and to implement the proper gating or steering of the input triggering signals, and such circuitry not only adds to the cost of the counters, but introduces additional sources of error and instability. In addition, the conventional approach has been to employ a tunnel diode stage for each digit position, i.e., in counting up to $n$ pulses $n$ tunnel diode stages would be used, with all of the stages being simultaneously reset when the last stage is triggered. Once again, counters of this type are both expensive and, due to the unduly large number of circuit components involved, error prone.

It is a primary object of this invention to provide a novel electronic counting circuit which overcomes the above-noted disadvantages attendant with the prior art counters.

It is a further object of this invention to provide such a counting circuit which advantageously employs bistable devices having substantially N-shaped characteristic curves including negative resistance regions, such as tunnel diodes, as the switching elements.

It is a further object of this invention to provide such a counting circuit which employs $n+1$ switching elements to count up to $2n$ input pulses, thereby realizing a substantial circuit economy by minimizing the components involved.

It is a further object of this invention to provide such counting circuit which employs relatively simple biasing and gating means including conventional diode networks and which functions in a manner such that when each tunnel diode is switched, it preconditions another tunnel diode by biasing it nearer to its triggering threshold so that it will in turn be switched by the next input pulse.

In a preferred embodiment the counting circuit of this invention includes a plurality of tunnel diodes with grounded cathodes. The anodes of the tunnel diodes are each connected to the mid-junction points of associated circuit paths connected in parallel between positive and negative input signal lines, with each circuit path including a series pair of conventional diodes to properly gate the input pulses. The anodes of adjacent tunnel diodes are also coupled to each other and to a DC power supply source through conventional diode and resistance networks that establish the necessary biasing potentials. Initially, all of the tunnel diodes in the counting stages are in their low voltage states and a single conditioning stage is in its high voltage state. Under these circumstances, the anode voltage of the conditioning stage biases the gating diodes so that only positive input signals will be effective. At the same time, the conditioning stage diverts part of its biasing current to the first counting stage thereby moving the operating point of same nearer to its triggering threshold and thus preconditioning it for switching to a high voltage state with the next input pulse. As soon as it switches, it preconditions the second counting stage, and so on. When the last counting stage is switched, an inverted feedback signal drives the conditioning stage back into its low voltage state, which now renders only negative input signals effective and at the same time, robs some of the biasing current from the first counting stage to thus precondition it for reversion back to its low voltage state upon application of the next input pulse. When the last counting stage is switched back to its low voltage state the full counting cycle has been completed. It will thus be appreciated that each stage has been switched twice during each complete cycle and each switching action corresponds to the counting of an input pulse, thus rendering each stage effective to count two pulses per cycle rather than just one. The conditions or states of the counting stages may be monitored and decoded by appropriate logic means, not part of or essential to an understanding of this invention, to provide a useful output in decimal or other form, as required.

The above and further objects and advantages of this invention will be readily apparent to those skilled in the electronics art from a consideration of the following more detailed description of specific embodiments of the invention, taken in conjunction with the accompanying drawing in which.

Figure 1:
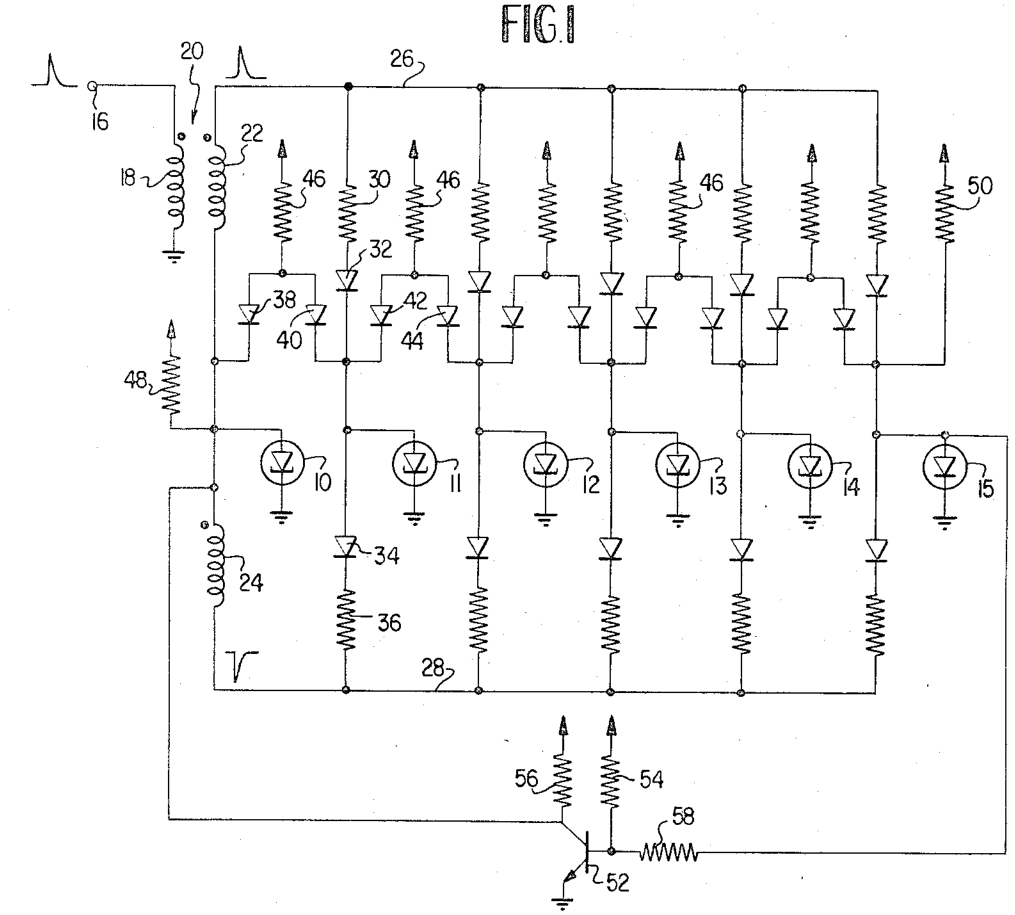
FIGURE 1 shows a schematic circuit diagram of an electronic counting circuit constructed in accordance with the teachings of this invention.

Referring now to the drawings, in which the same reference numerals have been used throughout the various figures to designate like structural elements, FIGURE 1 shows a plurality of tunnel diodes 10–15 with their cathode terminals connected to ground. Tunnel diode 10 performs a conditioning function, as more fully developed below, while tunnel diodes 11–15 perform the actual counting functions. Pulse input signals to be counted are applied at terminal 16 to the primary winding 18 of a coupling transformer 20. Secondary windings 22 and 24 are wound with the polarities shown to develop positive pulse signals on an upper triggering line 26 and corresponding negative pulse signals on a lower triggering line 28. A plurality of parallel circuit paths are connected between the two triggering lines to gate the incoming pulse signals to the tunnel diodes under the control of the conditioning stage. The circuit path associated with tunnel diode 11 includes, in series, a resistor 30, a pair of conventional diodes 32 and 34 poled as shown and a resistor 36 with the anode terminal of tunnel diode 11 being connected to the junction point between diodes 32 and 34.

The remaining gating circuit paths are identical and will not be described in detail.

The anodes of adjacent tunnel diodes are also coupled to each other by pairs of back-to-back conventional diodes, such as diodes 38 and 40 between tunnel diodes 10 and 11 and diodes 42 and 44 between tunnel diodes 11 and 12. The junction points between the diode pairs are connected to a source of DC operating potential, indicated in the drawing by solid arrows, through dropping resistors 46 and these diode-resistor networks supply the proper biasing currents to the tunnel diodes as described below. At each end of the counting circuit resistors 48 and 50 also couple the DC source to the anodes of tunnel diodes 10 and 15, respectively. An inverting feedback path is connected from the anode of tunnel diode 15 to the anode of tunnel diode 10 and includes a grounded emitter NPN transistor 52. The base and collector terminals of the transistor are connected to the DC source through the resistors 54 and 56, and a series resistor 58 is included in the base circuit.

Before describing the operation of the counting circuit shown in FIGURE 1, it may be well to briefly outline the essential operating and structural characteristics of tunnel diodes in order to facilitate a clear understanding of the invention. These elements consist of highly doped (impurity concentrations on the order of $10^{+19}$ net donor or acceptor atoms per cubic centimeter for germanium) semi-conductive PN junction devices having extremely narrow or thin junctions (on the order of 150 angstrom units or less), and were first described in an article by L. Esaki entitled "New Phenomenon in Narrow Germanium P–N Junctions," appearing in the January 1957 issue of the "Physical Review" on pages 603–605. They are characterized by an N-shaped operating curve, as shown in the coordinate voltage-current plot in FIGURE 2. As the voltage across the junction is increased from 0, the current rises steadily through point *a* until it reaches the peak or threshold portion of the curve just beyond point *b*. It then stabilizes in the high voltage-low current area at point *d*.

Figure 2:
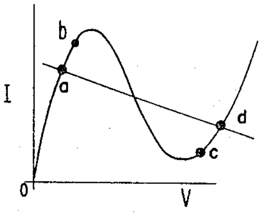
FIGURE 2 shows a coordinate plot of a typical voltage-current characteristic of a tunnel diode.

Considering now the operation of the counter circuit shown in FIGURE 1, tunnel diodes 12–15 are initially biased in their low voltage-high current states, corresponding to point *a* on the curve of FIGURE 2, by the DC source acting through the diode-resistor biasing networks. At the same time tunnel diode 10 is in its high voltage-low current state, corresponding to point *d* in FIGURE 2, due to the action of the inverting feedback path and tunnel diode 11 is biased near its triggering threshold at point *b* in FIGURE 2. Essentially, when tunnel diode 15 is at point *a* on the curve, its anode potential is near ground and the current flow from the DC source through resistors 54 and 58 is at a maximum. Because of the high voltage drop across resistor 54, the base-emitter potential of transistor 52 is lowered beyond cut-off and the transistor becomes non-conductive. This in turn raises the collector voltage of the transistor, which corresponds to the anode voltage of tunnel diode 10, and this increased voltage level is sufficient to bias diode 10 beyond its triggering threshold causing it to switch and stabilize at point *d* in FIGURE 2. The high anode potential of tunnel diode 10 now reverse biases the lower gating diodes 34 to render any subsequent negative input pulses induced in coupling transformer secondary 24 ineffective. At the same time, with tunnel diode 10 in this high voltage-low current condition, part of the current that it would otherwise draw from the DC source through resistor 46 and diode 38 is diverted through diode 40 into tunnel diode 11. This additional current flow is insufficient to trigger diode 11, but raises its operating level to point *b* in FIGURE 2, thus preconditioning it to be switched by the first input pulse.

When the first pulse to be counted is applied to input terminal 16, a positive pulse is induced in the coupling transformer secondary 22 and a corresponding negative pulse is induced in secondary 24. The negative pulse has no effect on the circuit, as explained above, because diodes 34 are reverse biased by the high anode potential of tunnel diode 10. The upper gating diodes 32 are forward biased by the same potential, however, and the positive pulse is therefore fed to each of the tunnel diodes 11–15 over line 26 and through the parallel gating circuit paths. The magnitude of the pulse, as limited by resistors 30, is insuffıcent to trigger tunnel diodes 12–15, but since tunnel diode 11 is already near its triggering threshold, it is immediately switched to its high voltage-low current state at point *d*. When this switching occurs, part of the biasing current from the supply source that tunnel diode 11 was drawing through resistor 46 and diode 42, is diverted through diode 44 and into tunnel diode 12, thus preconditioning it for switching with the second input pulse. Tunnel diodes 11–15 are thus triggered in sequence by the first five input pulses, as it switches.

When tunnel diode 15, the last one in the chain, is switched to its high voltage-low current state it raises the base potential of the transistor 52, rendering same conductive. The transistor now appears almost as a short to ground to resistor 56, and the anode potential of tunnel diode 10 drops to a fraction of its former value. This in turn switches tunnel diode 10 back to its low voltage-high current state corresponding to point *a* in FIGURE 2. With the anode potential of diode 10 at a low value, the upper gating diodes 32 now become reverse biased to render subsequent positive input pulses ineffective, while the lower gating diodes 34 become forward biased. Tunnel diode 10 now draws increased current from the DC source through resistor 46, which increases the voltage drop across the resistor and thus lowers the anode potential of tunnel diode 11. The potential is not lowered to the point where diode 11 switches, but it moves the operating level of the tunnel diode near the valley portion of the curve at point *c* in FIGURE 2.

When the sixth input pulse is applied, its negative counterpart over line 28 is gated through diodes 34 to the tunnel diodes 11–15. Its magnitude is not sufficient to switch diodes 12–15, but it pulls the anode potential of tunnel diode 11 below the valley threshold level, thus switching it back to its low voltage-high current state at a point *a*. This in turn preconditions tunnel diode 12 in the same manner to be switched back by the seventh input pulse. Tunnel diodes 11–15 thus switch back to their initial states in succession as the sixth through the tenth input pulses are applied. When tunnel diode 15 switches with the tenth pulse, the inverted feedback action once more drives tunnel diode 10 into its high voltage-low current state, as described earlier, and this in turn preconditions tunnel diode 11, thus completing a 10 input cycle and returning all of the tunnel diode stages to their initial conditions. It will be readily understood that any number of counting stages may be employed depending upon the needs of the designer, and the five stage counting circuit of FIGURE 1 is shown by way of example only.

Figure 3:
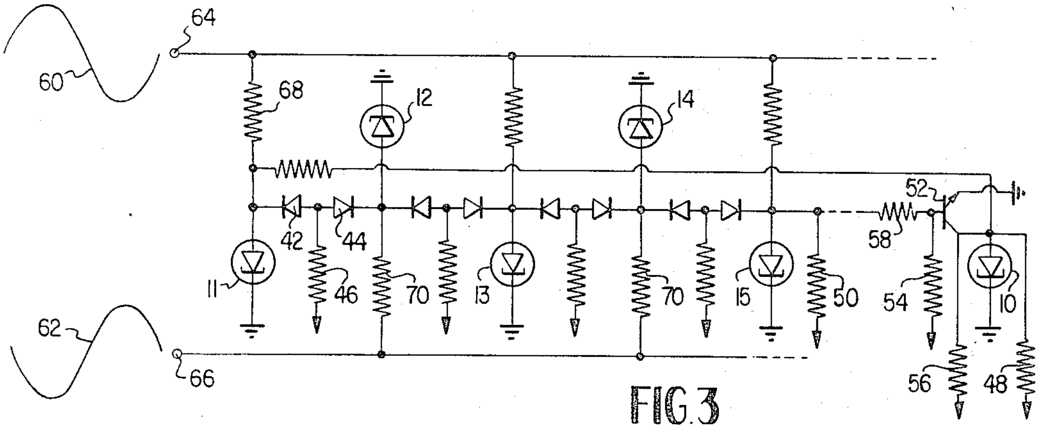
FIGURE 3 shows a schematic circuit diagram of an alternate embodiment of the invention.

In the alternate embodiment of the invention shown in FIGURE 3, an arrangement is presented which eliminates the need for gating diodes at the expense of requiring two complementary, alternating input signals. Although the schematic representation of this embodiment is somewhat different from that of FIGURE 1, the actual circuit arrangement is quite similar, as seen from the reference numeral correspondence, including the diode-resistor biasing and coupling networks, the inverted feedback path and the tunnel diode conditioning stage. In describing the operation of this embodiment, it will be assumed that all of the tunnel diodes are initially in the conditions stated in connection with FIGURE 1, i.e. tunnel diodes 12–15 are at point *a* in FIGURE 2, tunnel diode 10 is at point *d* and tunnel diode 11 is at point *b*. If a pair of complementary, alternating signals 60 and 62 are now applied to input terminals 64 and 66, respectively, the positive peak of signal 60 switches tunnel diode 11 to its high voltage-low current state through resistor 68. Tunnel diodes 13 and 15 are not affected since the magnitude of signal 60 is insufficient to switch them without their being preconditioned. When tunnel diode 11 switches to point *d* it pre-conditions tunnel diode 12 in the manner described above. Any spurious or premature switching of diode 12 is precluded since the negative peak of signal 62 is applied to it through resistor 70 during the switching of tunnel diode 11 and the enablement of the pre-conditioning action.

Approximately one-half of a cycle later the positive peak of signal 62 is applied to tunnel 12 and 14 through resistors 70 and, since only the former one is pre-conditioned, diode 12 is switched to its high voltage-low current state. The next positive half cycle of signal 60 switches pre-conditioned tunnel diode 13, and so on, until the last counting stage, in this case tunnel diode 15, is switched. With tunnel diode 15 at point *d* on the curve of FIGURE 2, its anode potential increases to the point where transistor 52 becomes saturated. This in turn lowers the anode potential of tunnel diode 10 below the valley threshold value causing it to switch back to its low voltage-high current state corresponding to point *a* on the curve of FIGURE 2. With tunnel diode 10 now conducting heavily the increased voltage drop across resistor 46 lowers the anode potential of tunnel diode 11 to point *c* in FIGURE 2, thus pre-conditioning it for reversion to its initial state upon the application of a negative triggering signal. Such a signal is supplied by the next negative half cycle of signal 60, which pulls tunnel diode 11 back to its low voltage-high current state. With the anode voltage of tunnel diode 11 near ground, tunnel diode 12 is pre-conditioned to point *c* in FIGURE 2 and the next half cycle of signal 62 switches it back to point *a*. This switching and pre-conditioning action continues down the chain until tunnel diode 15 is switched to point *a*, which in turn switches tunnel diode 10 to point *d* and pre-conditions tunnel diode 11, thus returning all of the stages to their initial states.

These ten counts will have been registered in only five complete cycles of either of the signals 60 or 62, since two stages are switched during each cycle. The functioning of the feedback loop and conditioning stage does not normally introduce any delay or cycle jumping into the circuit due to the extremely fast switching and response times of tunnel diodes. The circuit of FIGURE 3 particularly lends itself to use as a clock pulse generator since it may be driven by sinusoidal rather than pulse signals.

While there has been shown and described preferred forms of the present invention, many minor changes and modifications which will be apparent to those skilled in the art may be made without departing from the spirit and scope of the invention, which is intended to be limited only as defined in the following claims.

What is claimed is:

1. An electronic counting circuit comprising:

(a) a plurality of *n* counting stages arranged in a chain for sequential triggering and each including a bi-stable element having a substantially N-shaped characteristic curve including a negative resistance region, (b) combined biasing and coupling means connected between adjacent counting stages for supplying biasing currents at levels dependent upon the respective states of the bi-stable elements, thereby effecting a preconditioning action between adjacent stages, (c) a bi-stable conditioning stage, (d) means connecting the conditioning stage to the first counting stage in the chain, (e) an inverting feedback path connected between the last counting stage in the chain and the conditioning stage, whereby the conditioning stage is always maintained in a state opposite to that of the last counting stage to thereby pre-condition the first counting stage, and, (f) means for simultaneously applying bi-polar input signals to the counting stages, thereby providing for the sequential triggering of the counting stages from a first to a second state upon application of the first *n* input signals and from the second state back to the first state upon application of the second *n* input signals, whereby the *n* counting stages are effective to count 2*n* input signals.

2. An electronic counting circuit as defined in claim 1 wherein the bi-stable elements are tunnel diodes and the conditioning stage also includes a tunnel diode.

3. An electronic counting circuit as defined in claim 2 wherein the biasing and coupling means comprises a pair of back-to-back diodes connected between the anodes of adjacent tunnel diodes and means connecting the anode junctions of the diodes to a source of DC operating potential.

4. An electronic counting circuit comprising:

(a) a plurality of *n* counting stages arranged in a chain for sequential triggering and each including a bi-stable element having a substantially N-shaped characteristic curve including a negative resistance region, (b) a bi-stable conditioning stage, (c) combined biasing and coupling means connected between adjacent counting stages and between the conditioning stage and the first counting stage in the chain for supplying biasing currents at levels dependent upon the respective states of the bi-stable elements, thereby effecting a pre-conditioning action between adjacent stages, (d) an inverting feedback path connected between the last counting stage of the chain and the conditioning stage, whereby the conditioning stage is always maintained in a stage opposite to that of the last counting stage to thereby pre-condition the first counting stage, (e) means for developing complementary pulses of opposite polarity in response to a single input pulse, and (f) gating means responsive to the conditioning stage for applying one of the complementary pulses to all of the counting stages simultaneously, thereby providing for the sequential triggering of the counting stages from a first to a second state upon application of the first *n* input signals and from the second state back to the first state upon application of the second *n* input signals whereby the *n* counting stages are effective to count 2*n* input pulses.

5. An electronic counting circuit as defined in claim 4 wherein the bi-stable elements are tunnel diodes and the conditioning stage also includes the tunnel diode.

6. An electronic counting circuit as defined in claim 5 wherein the biasing and coupling means comprises a pair of back-to-back diodes connected between the anodes of adjacent tunnel diodes and means connecting the anode junctions of the diodes to a source of DC operating potential.

7. An electronic counting circuit as defined in claim 6 wherein the gating means comprises *n* pairs of series connected diodes whose junctions are connected to the anodes of the tunnel diodes in the counting stages.

8. An electronic counting circuit comprising:

(a) a plurality of *n* counting stages arranged in a chain for sequential triggering and each including a bi-stable element having a substantially N-shaped characteristic curve including a negative resistance region, (b) combined biasing and coupling means connected between adjacent counting stages for supplying biasing currents at levels dependent upon the respective states of the bi-stable elements, thereby effecting a pre-conditioning action between adjacent stages, (c) a bi-stable conditioning stage, (d) means connecting the conditioning stage to the first counting stage in the chain, (e) an inverting feedback path connected between the last counting stage in the chain and the conditioning stage, whereby the conditioning stage is always maintained in a state opposite to that of the last counting stage to thereby pre-condition the first counting stage, (f) means for applying a first alternating input signal to the odd numbered counting stages in the chain simultaneously, and (g) means for applying a second alternating input signal that is complementary to the first alternating input signal to the even numbered counting stages in the chain simultaneously, thereby providing for the sequential triggering of the counting stages from a first to a second state upon application of the first $n/2$ input signal cycles and from the second state back to the first state upon application of the second $n/2$ input signal cycles, whereby the $n$ counting stages are effective to count $2n$ input signal peaks.

9. An electronic counting circuit as defined in claim 8 wherein the bi-stable elements are tunnel diodes and the conditioning stage also includes a tunnel diode.

10. An electronic counting circuit as defined in claim 9 wherein the biasing and coupling means comprises a pair of back-to-back diodes connected between the anodes of adjacent tunnel diodes in the counting stages and means connecting the anode junctions of the diodes to a source of DC operating potential.

No references cited.

ARTHUR GAUSS, *Primary Examiner.*

J. ZAZWORSKY, *Assistant Examiner.*